United States Patent [19]

Tanabe et al.

[11] Patent Number: 5,552,700
[45] Date of Patent: Sep. 3, 1996

[54] CURRENT DETECTING DEVICE WITH A CORE HAVING AN INTEGRALLY FIXED ENGAGING MEMBER

[75] Inventors: Toru Tanabe; Kazuhide Seki, both of Yokohama; Masaaki Hatsumi; Hiroshi Shohara, both of Sagamihara, all of Japan

[73] Assignee: Stanley Electric Co., Ltd., Tokyo, Japan

[21] Appl. No.: 315,353

[22] Filed: Sep. 30, 1994

[51] Int. Cl.⁶ .................................................. G01R 33/00
[52] U.S. Cl. ...................................... 324/117 H; 324/127
[58] Field of Search ........................... 324/117 H, 117 R, 324/126, 127

[56] References Cited

U.S. PATENT DOCUMENTS

| 4,283,677 | 8/1981 | Niwa | 324/127 |
| 4,972,140 | 11/1990 | Okazaki et al. | 324/127 |
| 5,004,974 | 4/1991 | Cattaneo et al. | 324/127 |

Primary Examiner—Ernest F. Karlsen
Assistant Examiner—Russell M. Kobert
Attorney, Agent, or Firm—Fish & Richardson P.C.

[57] ABSTRACT

A shield member is placed in a case, and connector pins extend through respective through capacitors and are soldered to the shield member. A core is inserted in the case, and has an engaging member engaging an upstanding portion of the case, the core having a gap fitted over a ridge on the case. A printed-circuit board has positioning holes fitted over pins on the core. The connector pins have respective upper ends inserted through and soldered to through holes defined in the printed-circuit board. Attachment holes defined in the printed-circuit board are held in registry with threaded holes defined in an upper end of the upstanding portion of the case, and the printed-circuit board is fastened to the upstanding portion by screws threaded through the attachment holes into the threaded holes. A shield cover is bent over into alignment with an upper edge of the shield member, and teeth on the shield member are bent inwardly onto and soldered or spot-welded to the shield cover. A cover is finally fixed to the case by fitting teeth on the cover into recesses in an upper end of the cover.

10 Claims, 12 Drawing Sheets

CURRENT DETECTING DEVICE WITH A CORE HAVING AN INTEGRALLY FIXED ENGAGING MEMBER

BACKGROUND OF THE INVENTION

1. Field of the Invention

The present invention relates to a current detecting device for detecting a load current flowing through a load connected to a battery on an automobile.

2. Description of the Prior Art

Figure 1:
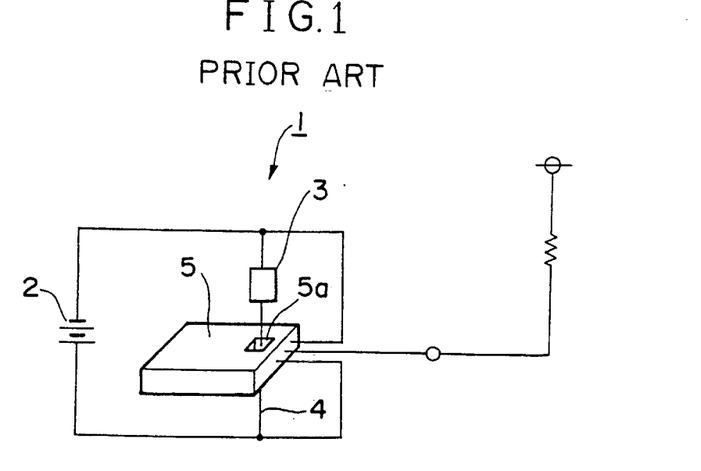
FIG. 1 is a schematic perspective view of a conventional current detecting device.
Figure 2:
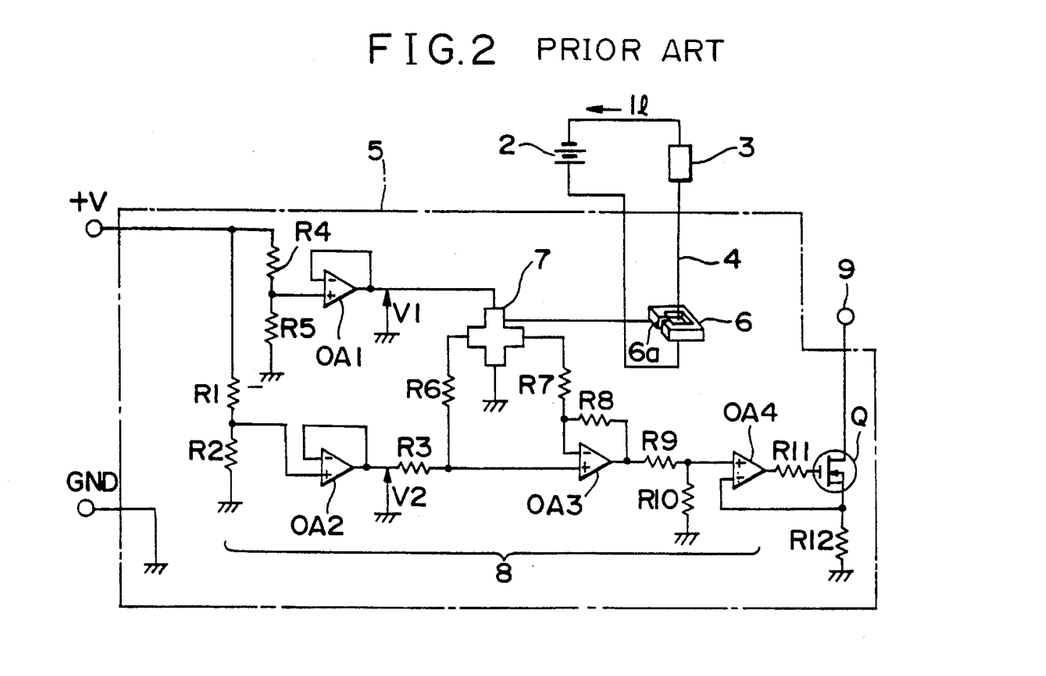
FIG. 2 is a circuit diagram of the conventional current detecting device shown in FIG. 1.

FIGS. 1 and 2 of the accompanying drawings schematically show a conventional current detecting device 1. As shown in FIG. 1, the conventional current detecting device 1 includes a case 5 having a through hole 5a defined therein, and a connector cord 4 connected to a load 3 which is connected to a battery 2 extends through the through hole 5a. The current detecting device 1 also has a ring-shaped core 6 (see FIG. 2) housed in the case 5 in surrounding relation to the through hole 5a in the case 5. The current detecting device 1 further includes a Hall-effect device 7 disposed in a gap 6a of the core 6, and a printed-circuit board 8 on which the Hall-effect device 7 is mounted. On the printed-circuit board 8, there are also mounted a power supply circuit for supplying a predetermined current to the Hall-effect device 7 and an amplifying circuit for amplifying a Hall voltage outputted from the Hall-effect device 7.

The current detecting device 1 operates as follows: A predetermined current flows from the power supply circuit on the printed-circuit board 8 to the Hall-effect device 7. Based on a current flowing through the connector cord 4, magnetic fluxes are produced across the gap 6a in the core 6, and the Hall-effect device 7 generates a Hall voltage depending on the produced magnetic fluxes. The Hall voltage is amplified by the amplifying circuit, and then outputted from an output terminal 9 to an external device such as an ammeter, for example. In this manner, the current flowing through the connector cord 4 is detected by the current detecting device 1 while the current detecting device 1 is being held out of contact with the connector cord 4.

It is necessary for the current detecting device 1 to detect the current flowing through the connector cord 4 accurately and stably for a long period of time. To meet such a requirement, it is necessary to fixedly position the core 6 accurately in the case 5 and also to position the Hall-effect device 7 accurately with respect to the gap 6a in the core 6. Accurate positioning of the core 6 and the Hall-effect device 7, however, results in an increased number of parts such as attachment members, a complex structure, and an increased cost thereof. Since the Hall-effect device 7, the power supply circuit, and the amplifying circuit need to be electromagnetically shielded, the current detecting device 1 is further complicated in structure. Furthermore, inasmuch as the shielding members used have to be grounded, it is cumbersome to assemble the parts in the case 5. Another problem is that since the Hall voltage produced when the Hall-effect device 7 detects a small current is very low, such a small current is detected with low accuracy.

SUMMARY OF THE INVENTION

It is therefore an object of the present invention to provide a current detecting device which is of a relatively simple structure, can easily be assembled, has circuits easily and reliably shielded, and is capable of detecting a small current reliably and accurately.

According to the present invention, there is provided a current detecting device comprising a case assembly having a through hole for insertion therethrough of an electric wire which carries a current to be detected, a ring-shaped core disposed in the case assembly in surrounding relation to the through hole, the ring-shaped core having a gap defined therein, a printed-circuit board disposed in the case assembly, a Hall-effect device mounted on the printed-circuit board and disposed in the gap, a power supply circuit mounted on the printed-circuit board for supplying a current to the Hall-effect device, an amplifying circuit mounted on the printed-circuit board for amplifying a Hall voltage produced by the Hall-effect device, a first engaging member of an insulating material integrally formed with the gap, and a second engaging member disposed on an inner surface of the case assembly, the first engaging member being held in engagement with the second engaging member, thereby positioning the core in place within the case assembly.

According to the present invention, there is also provided a current detecting device comprising a case assembly having a through hole for insertion therethrough of an electric wire which carries a current to be detected, a ring-shaped core disposed in the case assembly in surrounding relation to the through hole, the ring-shaped core having a gap defined therein, a printed-circuit board disposed in the case assembly, a Hall-effect device mounted on the printed-circuit board and disposed in the gap, a power supply circuit mounted on the printed-circuit board for supplying a current to the Hall-effect device, and an amplifying circuit mounted on the printed-circuit board for amplifying a Hall voltage produced by the Hall-effect device, the printed-circuit board having a positioning hole defined therein closely to the Hall-effect device, the core having a pin disposed closely to the gap and fitted in the positioning hole, thereby positioning the Hall-effect device in the gap.

According to the present invention, there is further provided a current detecting device comprising a case assembly having a through hole for insertion therethrough of an electric wire which carries a current to be detected, a ring-shaped core disposed in the case assembly in surrounding relation to the through hole, the ring-shaped core having a gap defined therein, a printed-circuit board disposed in the case assembly, a Hall-effect device mounted on the printed-circuit board and disposed in the gap, a power supply circuit mounted on the printed-circuit board for supplying a current to the Hall-effect device, an amplifying circuit mounted on the printed-circuit board for amplifying a Hall voltage produced by the Hall-effect device, a shield member shaped as a substantially rectangular parallelepiped and made of a nonmagnetic electrically conductive material, the shield member having an open side and being disposed in the case assembly, and a shield cover having an edge joined to an edge of the shield member, the shield cover being placed over the shield member in covering relation to the open side of the shield member, the shield member having a tooth projecting from a side edge thereof and bent over onto and joined to the shield cover, thereby providing a shield around the ring-shaped core and the printed-circuit board in the case assembly.

According to the present invention, there is also provided a current detecting device comprising a case assembly having a through hole for insertion therethrough of an electric wire which carries a current to be detected, a ring-shaped core disposed in the case assembly in surrounding relation to the through hole, the ring-shaped core having a gap defined therein, a printed-circuit board disposed in the case assembly, a Hall-effect device mounted on the printed-circuit board and disposed in the gap, a power supply circuit mounted on the printed-circuit board for supplying a current to the Hall-effect device, an amplifying circuit mounted on the printed-circuit board for amplifying a Hall voltage produced by the Hall-effect device, a shield member disposed in the case assembly, a plurality of upstanding connector pins disposed in the case assembly and extending through the shield member via through capacitors, the connector pins being connected directly to through holes defined in the printed-circuit board, the through capacitors including a shorted-type through capacitor, the connector pins including a connector pin for connection to ground which extends through the shield member via the shorted-type through capacitor and is connected to the shield member.

The current detecting device further comprises a plurality of substantially U-shaped electrically conductive terminals embedded in a region of the case assembly which accommodates the core, the terminals having inner and outer ends, and a connector printed-circuit board mounted on the case assembly and having a plurality of patterns each connecting the inner end of one terminal to the outer end of an adjacent terminal, the terminals and the patterns jointly providing a coil composed of a number i of turns disposed around the core.

The first engaging member of an insulating material which is integrally formed with the gap in the core is brought into engagement with the second engaging member on an inner surface of the case, thereby positioning the core securely in the case. Since the core can reliably be arranged in place in the case simply by engagement with the case, the current detecting device can be assembled easily and highly accurately through a simple structure.

The Hall-effect device mounted on the printed-circuit board is positioned centrally in the gap in the core by fitting the positioning holes over the pins on the core. Consequently, the Hail-effect device can be positioned reliably and highly accurately through a simple process.

The shield member is shaped as a substantially rectangular parallelepiped and made of a nonmagnetic electrically conductive material, the shield member having an open side and being disposed in the case assembly. The shield cover has an edge joined to an edge of the shield member. The shield cover is placed over the shield member in covering relation to the open side of the shield member. The tooth projecting from a side edge of the shield member are bent over onto and joined to the shield cover, thereby providing a shield around the ring-shaped core and the printed-circuit board in the case assembly.

The upstanding connector pins are disposed in the case assembly and extend through the shield member via through capacitors. The connector pins are connected directly to through holes defined in the printed-circuit board. The through capacitors include a shorted-type through capacitor, and the connector pins include a connector pin for connection to ground which extends through the shield member via the shorted-type through capacitor and is connected to the shield member. Since it is not necessary to connect a ground wire to the shield member using a harness or the like, the number of parts used is reduced, and the shield member can be grounded easily through a simple structure.

The coil is wound directly around the core. After the core has been housed in the case, the inner ends of the terminals are connected successively to the outer ends of the adjacent terminals with patterns on the printed-circuit board, or with metal wires, or the ends of the terminals are directly connected, thereby providing a coil of plural turns around the core. Inasmuch as magnetic fluxes produced in the coil by the coil and flowing across the gap to act on the Hall-effect device are commensurate with the number of turns of the coil, even a small current flowing through the coil can reliably be detected by the Hall-effect device.

The above and other objects, features, and advantages of the present invention will become apparent from the following description when taken in conjunction with the accompanying drawings which illustrate preferred embodiments of the present invention by way of example.

DETAILED DESCRIPTION OF 2THE PREFERRED EMBODIMENTS

Figure 3:
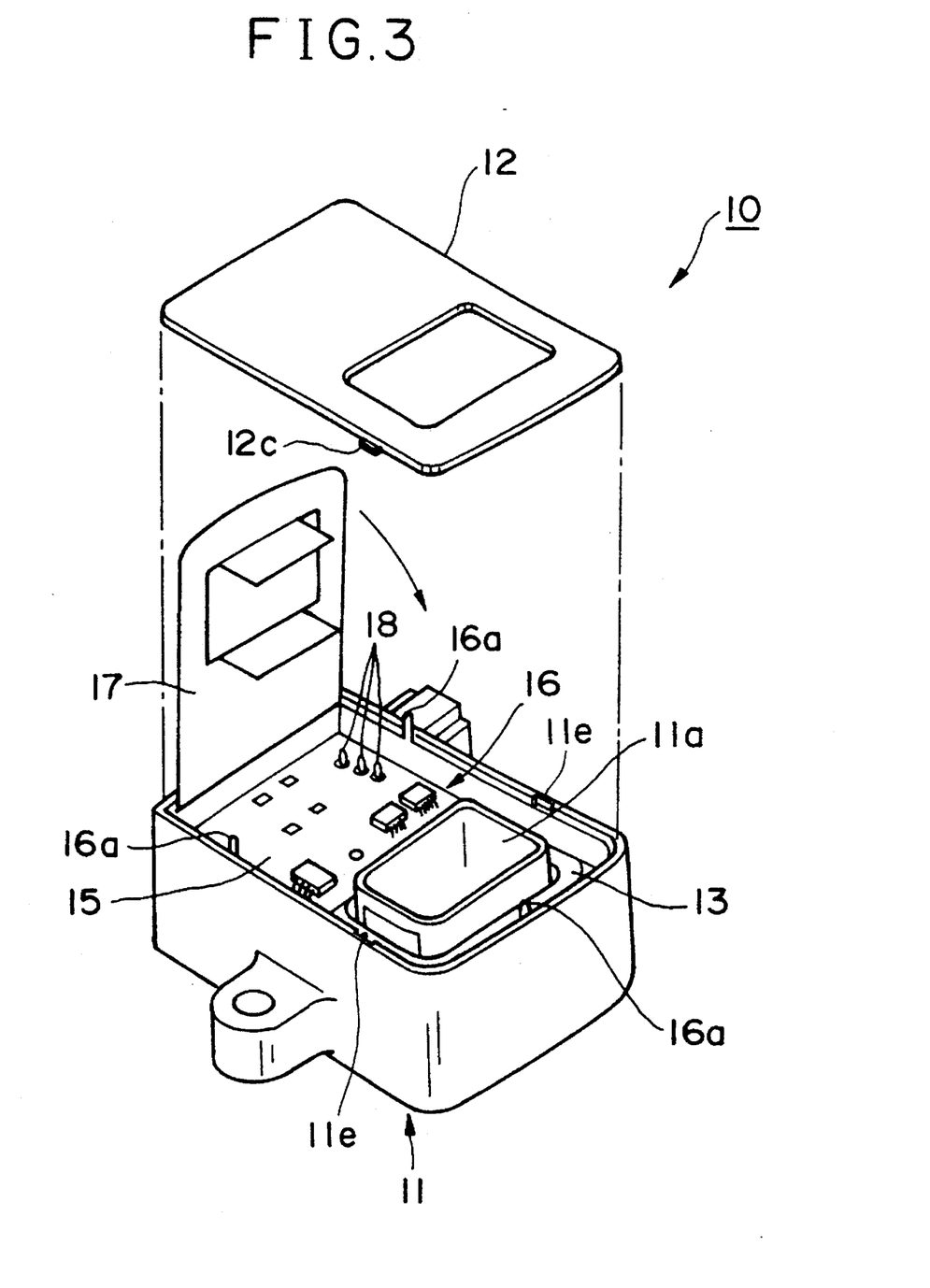
FIG. 3 is an exploded perspective view of a current detecting device, with a cover detached, according to an embodiment of the present invention.

FIG. 3 shows in exploded perspective a current detecting device 10, with a cover detached, according to an embodiment of the present invention. As shown in FIG. 3, the current detecting device 10 has an upwardly open case 11 having a through hole 11a defined therein through which there extends an electric wire that carries an electric current to the detected, a cover 12 for covering an upper opening of the case 11, and a rectangular (ring-shaped) gapped core 13 housed in the case 11 in surrounding relation to the through hole 11a in the case 11. The current detecting device 10 also has a Hall-effect device 14 (see FIG. 4) disposed in a gap 13a defined in the core 13, a printed-circuit board 15 on which the Hall-effect device 14 is mounted, the printed-circuit board 15 supporting thereon a power supply circuit for supplying a predetermined current to the Hall-effect device 14 and an amplifying circuit for amplifying a Hall voltage outputted from the Hall-effect device 14, a shield member 16 and a shield cover 17 disposed along inner surfaces of the case 11 and the cover 12.

Figure 5A:
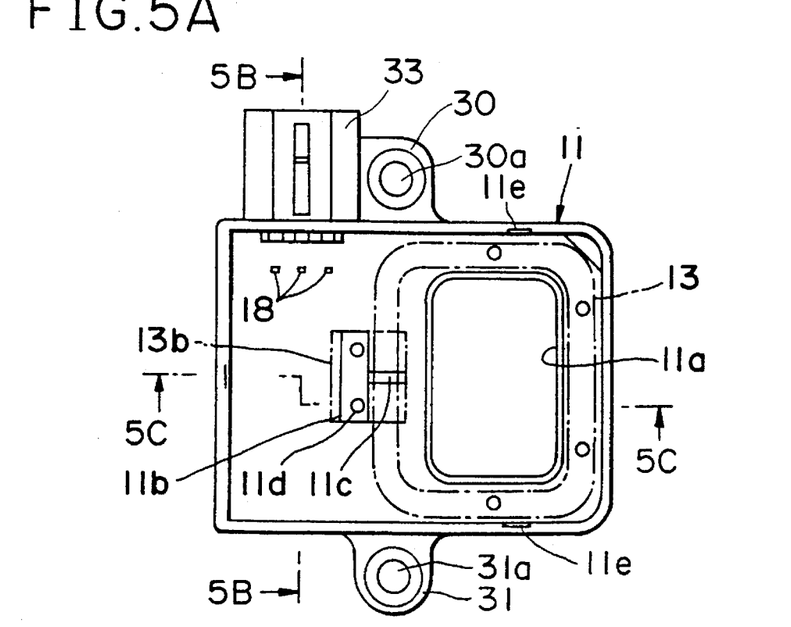
FIG. 5A is a plan view of a case of the current detecting device shown in FIG. 3.
Figure 5B:
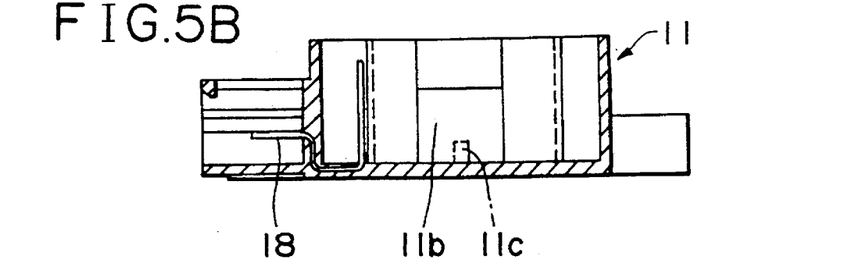
FIG. 5B is a cross-sectional view taken along line 5B—5B of FIG. 5A.
Figure 5C:
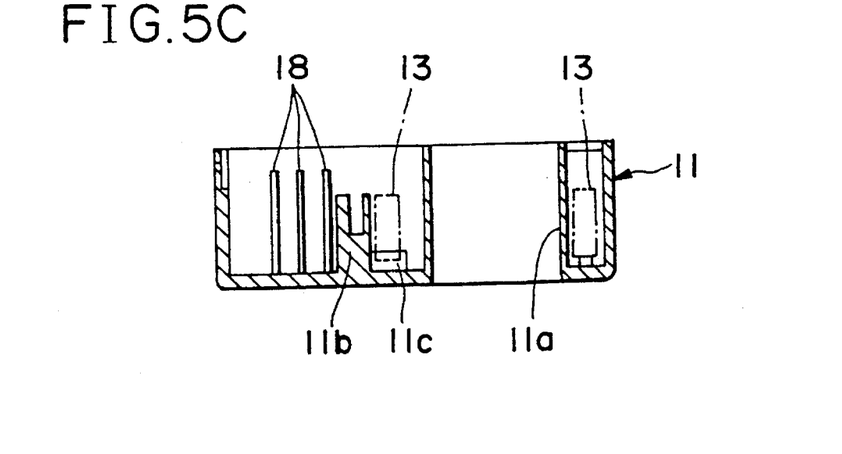
FIG. 5C is a cross-sectional view taken along line 5C—5C of FIG. 5A.

As shown in FIGS. 5A, 5B, and 5C, the case 11 has a space defined around the through hole 11a for accommodating the ring-shaped core 13 therein, and includes an upstanding portion 11b extending upwardly from a bottom panel thereof for engaging an engaging member (described below) of the core 13, and a low ridge 11c extending from a lower region of the upstanding portion 11b toward the through hole 11a.

Figure 6A:
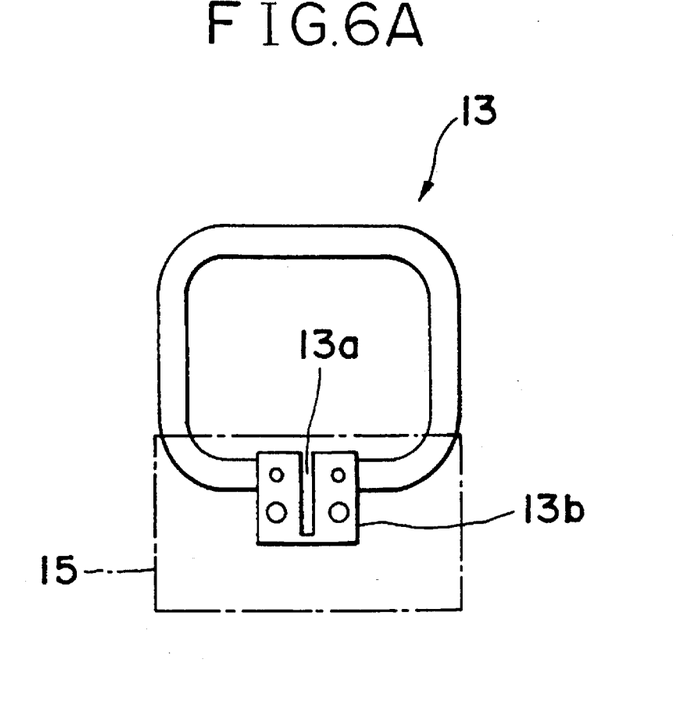
FIG. 6A is a plan view of a core of the current detecting device shown in FIG. 3.
Figure 6B:
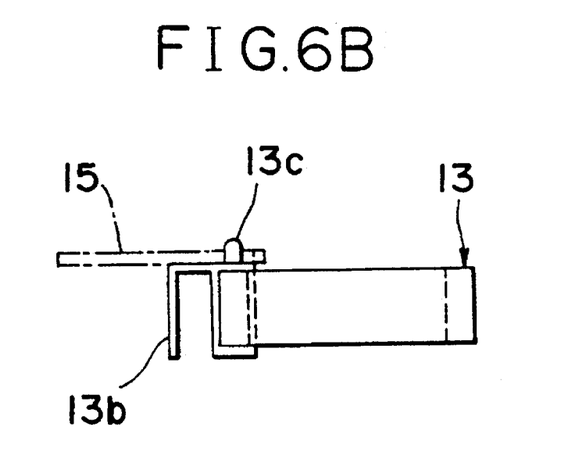
FIG. 6B is a side elevational view of the core of the current detecting device shown in FIG. 3.

As shown in FIGS. 6A and 6B, the core 13 has an engaging member 13b of an insulating material which defines the gap 13a therein. When the core 13 is placed in the case 11, the engaging member 13b engages the upstanding portion 11b of the case 11, thereby holding the core 13 securely longitudinally in the case 11. At the same time, the gap 13a is fitted over the ridge 11c on the bottom panel of the case 11, thereby holding the core 13 securely vertically in the case 11. In this manner, the core 13 is positioned in place in the case 11.

Figure 4:
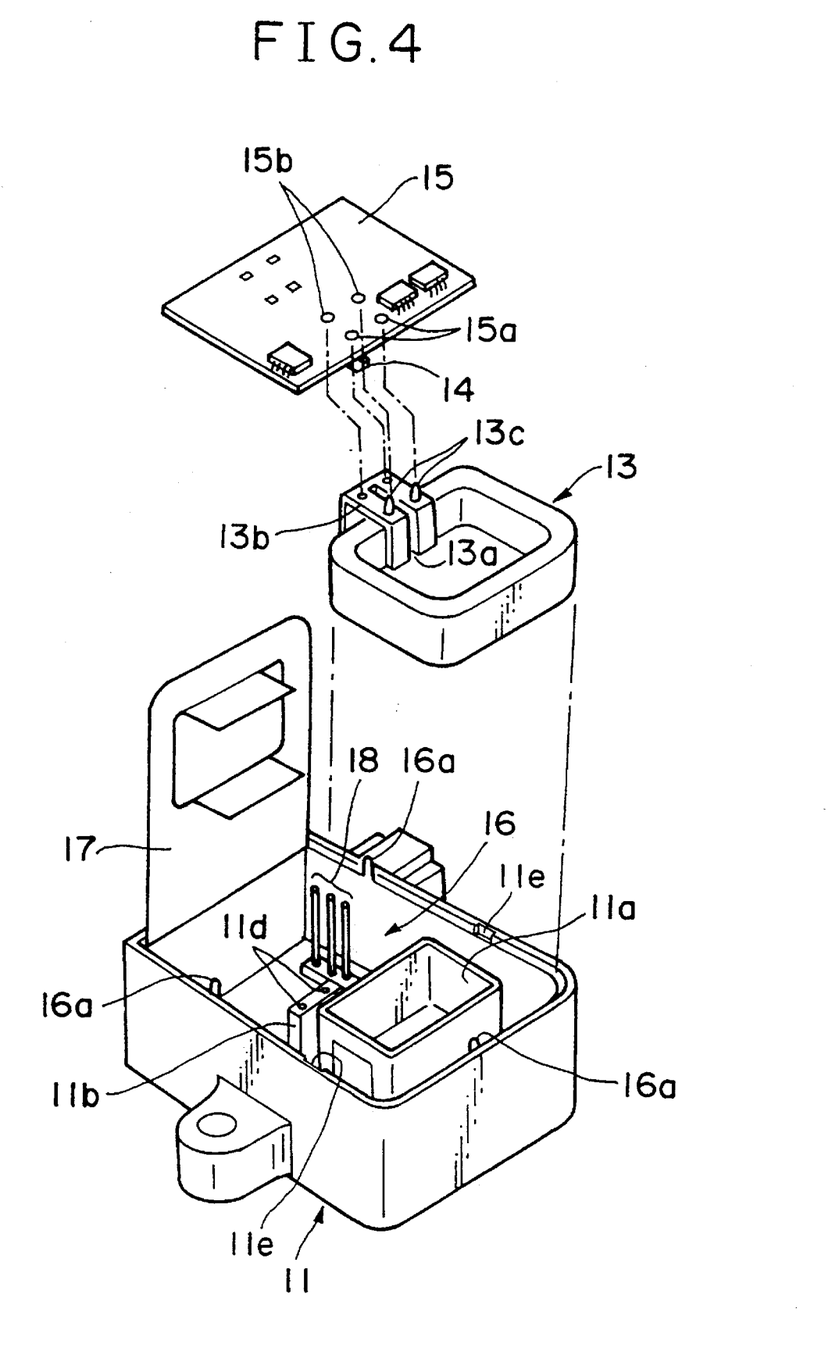
FIG. 4 is an exploded perspective view of the current detecting device shown in FIG. 3, with a core anti a printed-circuit board detached.

The core 13 has a pair of pins 13c projecting upwardly from an upper surface of the engaging member 13b. As shown in FIG. 4, the printed-circuit board 15 has a pair of positioning holes 15a defined therein near the Hall-effect device 14, and the pins 13c are fitted respectively in the positioning holes 15a. The Hall-effect device 14 which is mounted on the printed-circuit board 15 is thus positioned centrally in the gap 13a.

The shield member 16 is made of a nonmagnetic electrically conductive sheet material, such as copper, and has an upwardly open, substantially rectangular parallelepiped disposed along an inner surface of the case 11. The shield cover 17 is also made of a nonmagnetic electrically conductive sheet material, such as copper. The shield cover 17 has one end hinged to a side edge of the shield member 16, so that the shield Cover 17 can be opened and closed with respect to the upper opening of the shield member 16. After the shield cover 17 is brought down to cover the upper opening of the shield member 16, teeth 16a projecting upwardly from opposite ;side edges of the shield member 16 are bent over onto the shield cover 17, and then soldered or spot-welded to the shield cover 17. The shield member 16 and the shield cover 17 thus securely joined to each other jointly shaped as a closed, substantially rectangular parallelepiped.

The shield member 16 and the shield cover 17 are formed by cutting and drawing metal sheets, and soldering or spot-welding the shaped metal sheets. The shield cover 17 may have small rectangular holes defined in an end thereof, and the teeth 16a may be inserted into the small rectangular holes and bent over to secure the shield member 16 and the shield cover 17 to each other. Alternatively, the teeth 16a may be of an L-shaped structure and have respective small threaded holes, and the shield member 16 and the shield cover 17 may be fastened to each other by small screws which extend through holes defined in the shield cover into the small threaded holes defined in the teeth 16a.

The shield member 16 and the shield cover 17 may alternatively be molded of synthetic resin, and a metal film may be deposited on inner and outer surfaces of the shield member 16 and the shield cover 17 by vacuum evaporation, thus forming shield layers on the shield member 16 and the shield cover 17. Alternatively, the shield member 16 and the shield cover 17 may be molded of metal or electrically conductive synthetic resin. If the shield member 16 and the shield cover 17 are be molded of metal, the shield cover 17 should preferably be shaped so as to be fitted in the shield member 16 because the shield cover 17 molded of metal would not easily be hinged to the shield member 16.

Figures 7A, 7B:
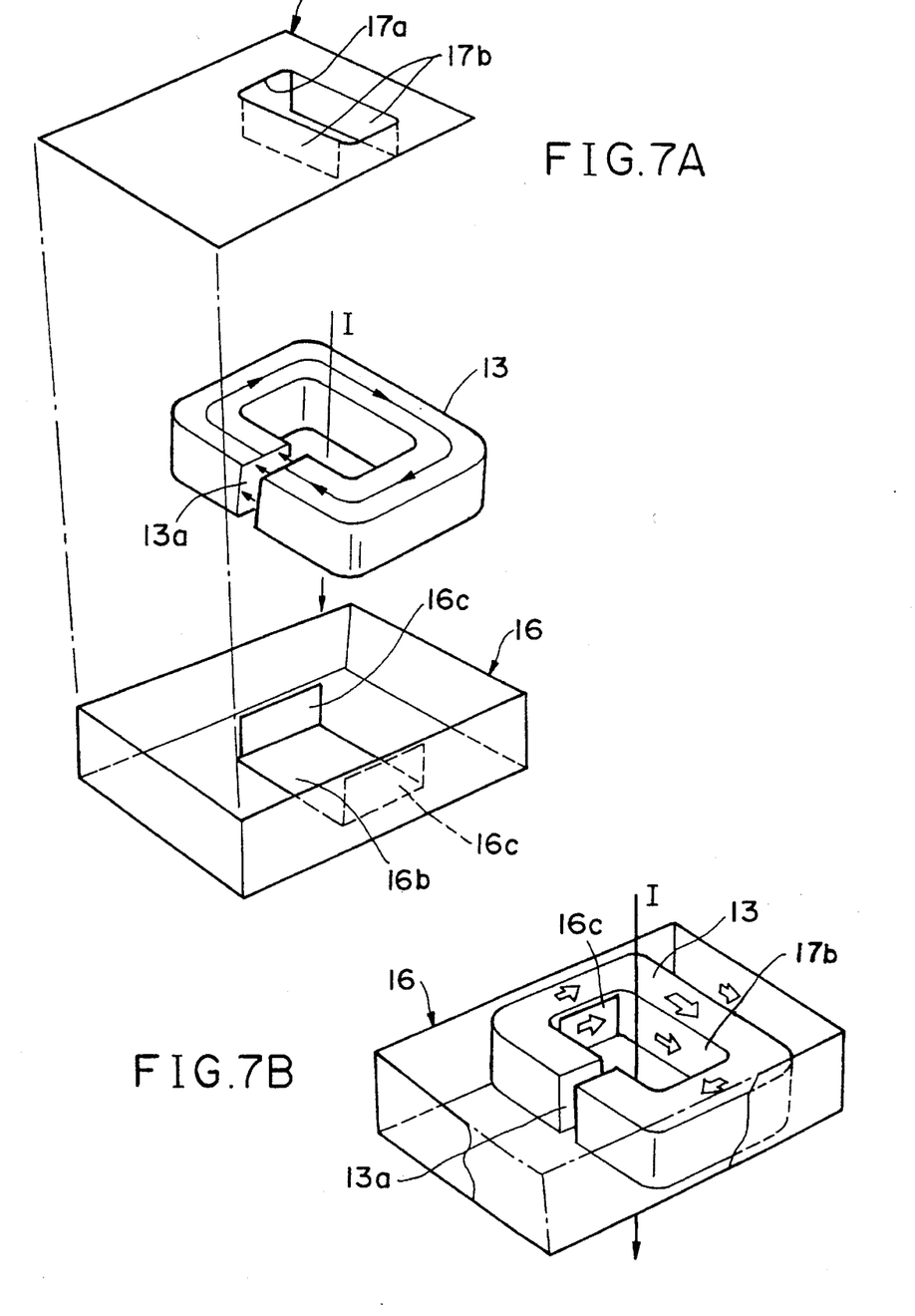
FIG. 7A is an exploded perspective view of a shield member, a shield cover, and the core of the current detecting device shown in FIG. 3.
FIG. 7B is a perspective view of the shield member, the shield cover, and the core, which are assembled together, of the current detecting device shown in FIG. 3.

As shown in FIG. 7, the shield member 16 has a rectangular window 16b defined in a bottom panel thereof in registry with the through hole 11a, and a pair of upstanding walls 16c extending upwardly from opposite transverse edges of the window 16b. The shield cover 17 has a rectangular window 17a defined therein in registry with the through hole 11a, and a pair of upstanding walls 17b extending downwardly from opposite longitudinal edges of the window 17a. When the shield member 16 and the shield cover 17 are combined with each other, the upstanding walls 16c, 17b are alternately arranged, surrounding the through hole 11a.

As shown in FIG. 7B, the core 13 and the printed-circuit board 15 (see FIGS. 3 and 4) which supports the Hall-effect device 14 and the power supply and amplifying circuits are shielded by the shield member 16 and the shield cover 17. When a current to be detected flows through the through hole 11a in the direction indicated by the arrow I, magnetic fluxes are produced in the core 13 as indicated by the arrows and run across the gap 13a.

Figure 8A:
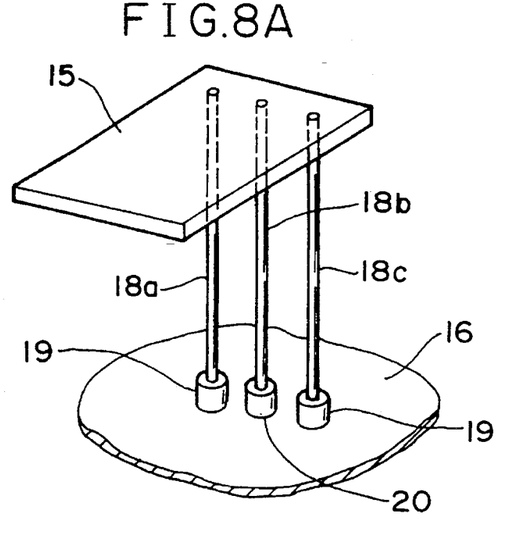
FIG. 8A is a fragmentary perspective view of connector pins vertically disposed in a case shown in FIG. 3, the shield member, and the printed-circuit board.

As shown in FIGS. 4 and 5A through 5C, three connector pins 18 are vertically disposed integrally in the case 11 and extend partly through the shield member 16. The connector pins 18 have respective upper ends inserted in and soldered to respective through holes that are defined in the printed-circuit board 15, as shown in FIG. 3. The connector pins 18 have output ends coupled to a connector 33. As shown in FIG. 8A, each of the connector pins 18 extends through the shield member 16 via a through capacitor which serves as a bypass capacitor.

Figures 8B, 8C:
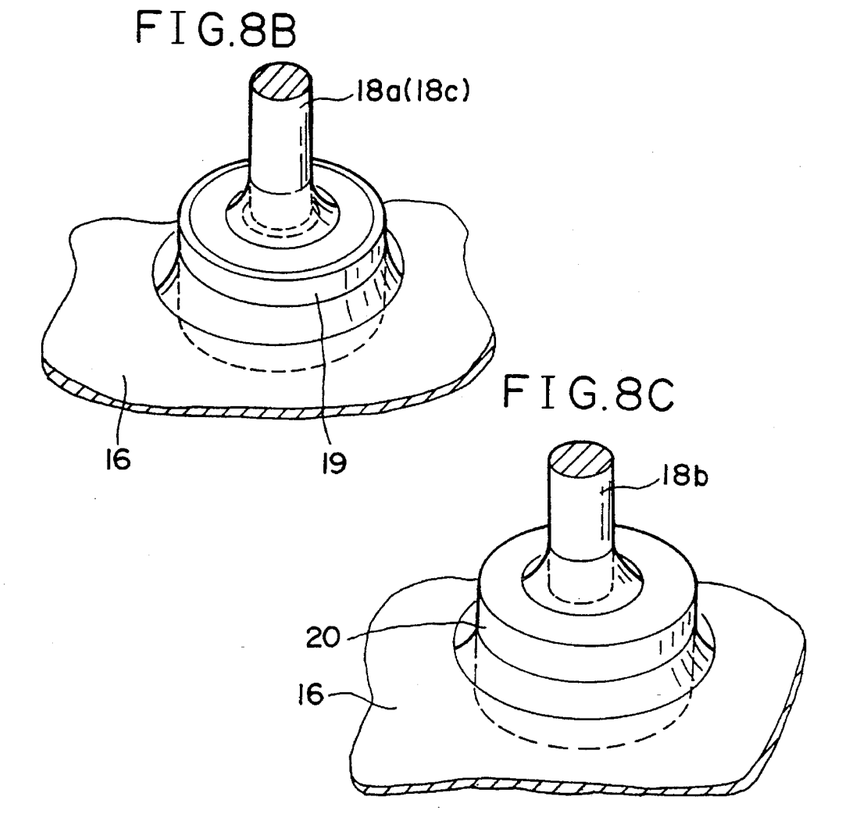
FIG. 8B is an enlarged fragmentary perspective view of one of the connector pins.
FIG. 8C is an enlarged fragmentary perspective view of another of the connector pins, which serves as a ground pin.

In FIGS. 8A through 8C, the three connector pins 18 are denoted at 18a, 18b, 18c, respectively. The connector pins 18a, 18c, which are positioned one on each side of the connector pin 18b, extend through the shield member 16 via respective through capacitors 19, which have outer sides soldered to the shield member 16. The central connector pin 18b, which serves as a connector pin for connection to ground, extends through the shield member 16 via a shorted-type through capacitor 20, which has outer sides soldered to the connector pin 18b and the shield member 16. The shield member 16 is therefore connected to ground through the connector pin 18b.

The current detecting device 10 is assembled as follows: The shield member 16 is inserted in the case 11, and the connector pins 18 are inserted through the through capacitors 19, 20 and soldered, with the shield cover 17 being held open. The core 13 is then inserted into the case 11 to bring the engaging member 13b thereof into engagement with the upstanding portion 11b, with the gap 13a fitted over the ridge 11c. The core 13 can therefore be installed easily and reliably in position in the case 11.

Instead of the through capacitors 19, connectors fixed to the case 11 may be employed for connection to the connector pins 18a, 18c. Specifically, the contacts of the connectors may be connected to the connector pins 18a, 18c. Since the connectors do not operate as bypass capacitors, suitable bypass capacitors having a suitable capacitance for removing noise from a detected signal may be included. Alternatively, metal terminals may be mounted on the case 11 by insert molding, and used as the connector pins 18a, 18c.

Then, the positioning holes 15a in the printed-circuit board 15 are fitted over the respective pins 13c of the core 13, and the upper ends of the connector pins 18 are fitted respectively in the through holes in the printed-circuit board 15. Thereafter, attachment holes 15b defined in the printed-circuit board 15 are held in registry with threaded holes 11d defined in the upper end of the upstanding portion 15b of the case, and screws are threaded through the attachment holes 15b into the threaded holes 11d, thereby securely fixing the printed-circuit board 15 in position in the case 11.

The Hall-effect device 14 is now positioned accurately centrally in the gap 13a in the core 13.

The upper ends of the connector pins 18 which project upwardly from the through holes in the printed-circuit board 15 are soldered to the through holes, and the shield cover 17 is bent over into alignment with the upper edge of the shield member 16 as indicated by the arrow in FIG. 3. The shield cover 17 is then soldered to the upper edge of the shield member 16. The shield cover 17 now closes the upper opening of the shield member 16, thus shielding the components within the shield member 16. Finally, teeth 12c of the cover 12 are fitted into respective recesses 11e in the upper end of the case 11, thereby fixing the cover 12 to the case 11. Alternatively, the cover 12 may have a flange, rather than the teeth, for covering an outer side of the case 11 near the opening thereof. With such a modified structure, the flange of the cover 12 is pressed into the case 11. The current detecting device 10 is now completed.

Figure 9A:
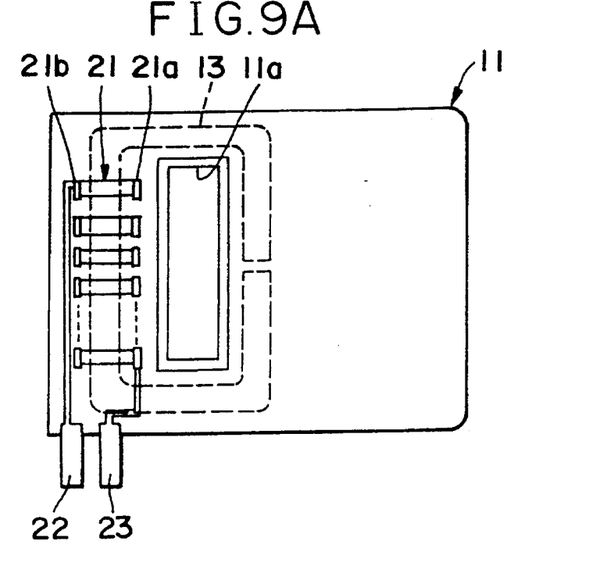
FIG. 9A is a plan view of a case according to another embodiment of the present invention.
Figure 9B:
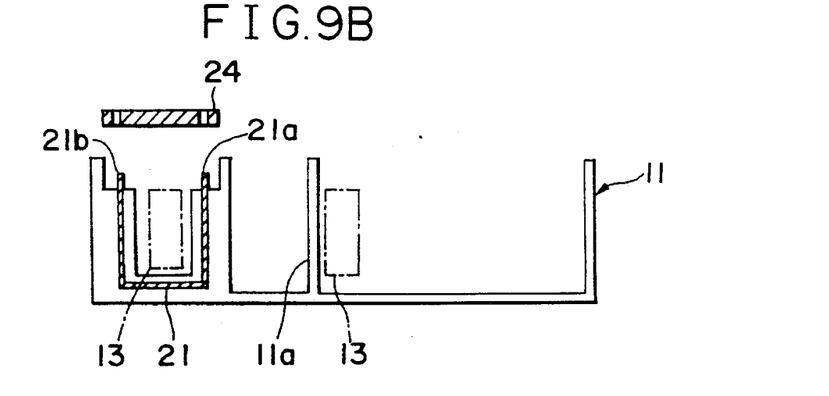
FIG. 9B is a cross-sectional view of the case shown in FIG. 9A.

FIGS. 9A and 9B show a case according to another embodiment of the present invention. In FIGS. 9A and 9B, a plurality of substantially U-shaped parallel terminals 21 are embedded in a case 11 by insert molding. The terminals 21 are disposed in a region of the case 11 which accommodates a portion of the core 13 remote from the gap 13a, and surround that portion of the core 13. The terminals 21 have inner and outer upper ends 21a, 21b projecting upwardly. Those terminals 21 which are positioned on respective opposite ends of the terminal array have respective inner and outer upper ends connected to external connector terminals 22, 23 which extend out of the case 11. The external connector terminals 22, 23 may be used directly for connection by a screw, soldering, or the like to an electric wire which carries a current to be detected. However, it is preferable to employ a connector to connect the external connector terminals 22, 23 to an electric wire which carries a current to be detected.

Figure 10:
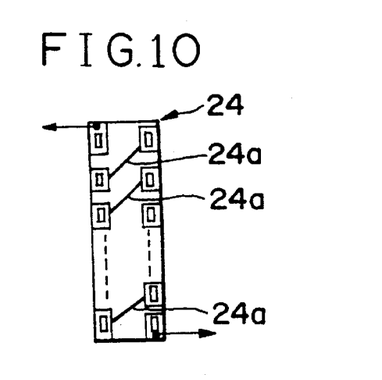
FIG. 10 is a plan view of a printed-circuit board for terminal connection, for use in the case shown in FIGS. 9A and 9B.

A connector printed-circuit board 24 (see FIGS. 9B and 10) is placed on and connected to the terminals 21. As shown in FIG. 10, diagonal or oblique patterns 24a are disposed on an upper or lower surface of the connector printed-circuit board 24, each for connecting the inner end 21a of one terminal 21 to the outer end 21b of an adjacent terminal 21. Through holes are defined in opposite edges of the connector printed-circuit board 24 at ends of the oblique patterns 24a. The terminals 21 are inserted into the respective through holes and soldered thereto, so that the terminals 21 and the oblique patterns 24a jointly serve as a coil to be wound around the core 13.

Figure 11A:
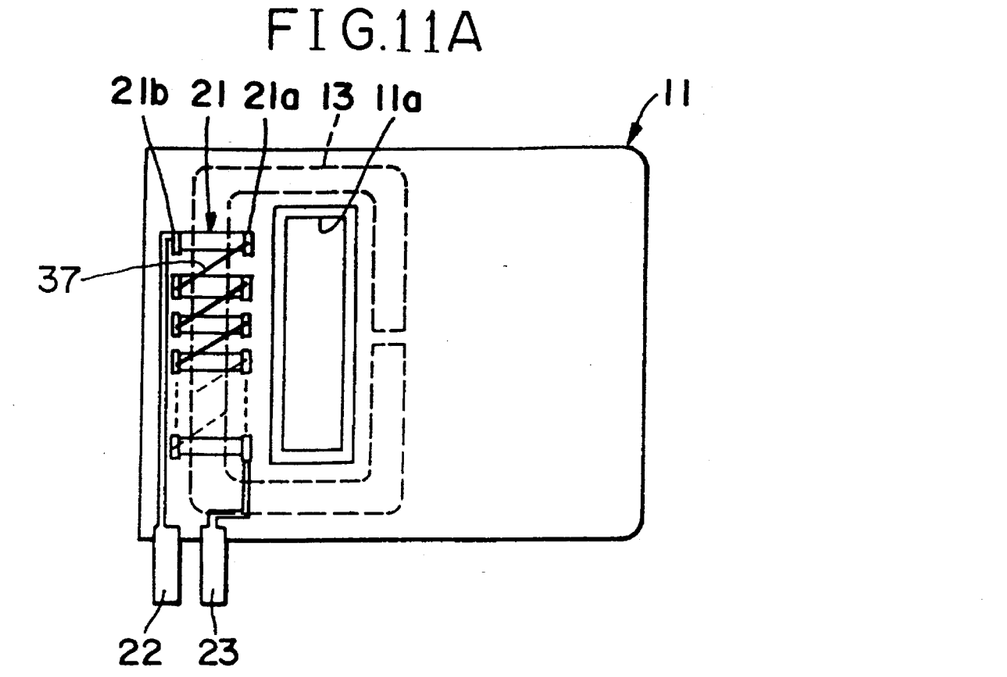
FIG. 11A is a plan view of a modification of the case shown in FIGS. 9A and 9B.
Figure 11B:
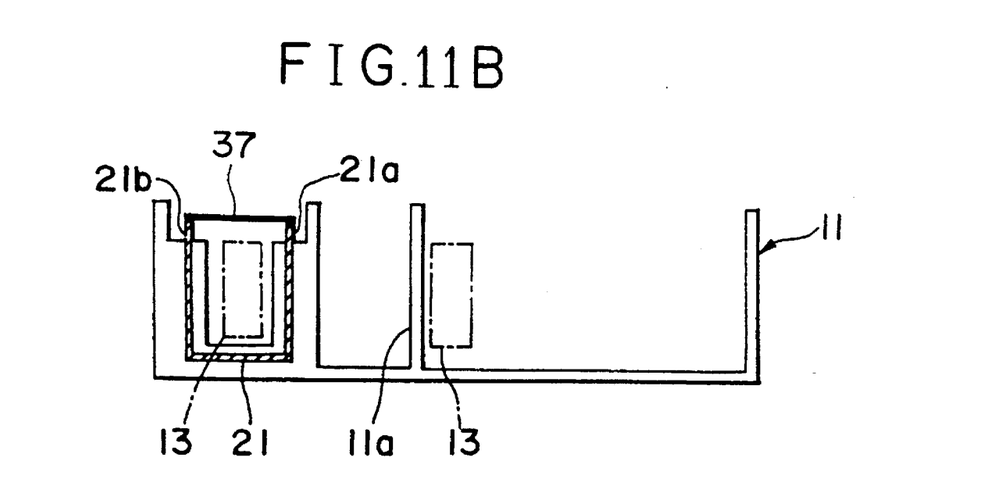
FIG. 11B is a cross-sectional view of the modified case shown in FIG. 11A.

As shown in FIGS. 11A and 11B, the connector printed-circuit board 24 may be dispensed with, and metal wires 37 may be soldered obliquely to the terminals 21, each connecting the inner end 21a of one terminal 21 to the outer end 21b of an adjacent terminal 21. The terminals 21 and the oblique metal wires 37 jointly serve as a coil to be wound around the core 13.

Alternatively, the terminals 21 may have elongate inner and outer upper ends, and the elongate inner and outer upper ends may be bend inwardly into an L shape and soldered obliquely such that the inner end 21a of one terminal 21 is connected to the outer end 21b of an adjacent terminal 21. The terminals 21 thus soldered jointly serve as a coil to be wound around the core 13. With this arrangement, neither the connector printed-circuit board 24 or the metal wires 37 are necessary.

Figure 12:
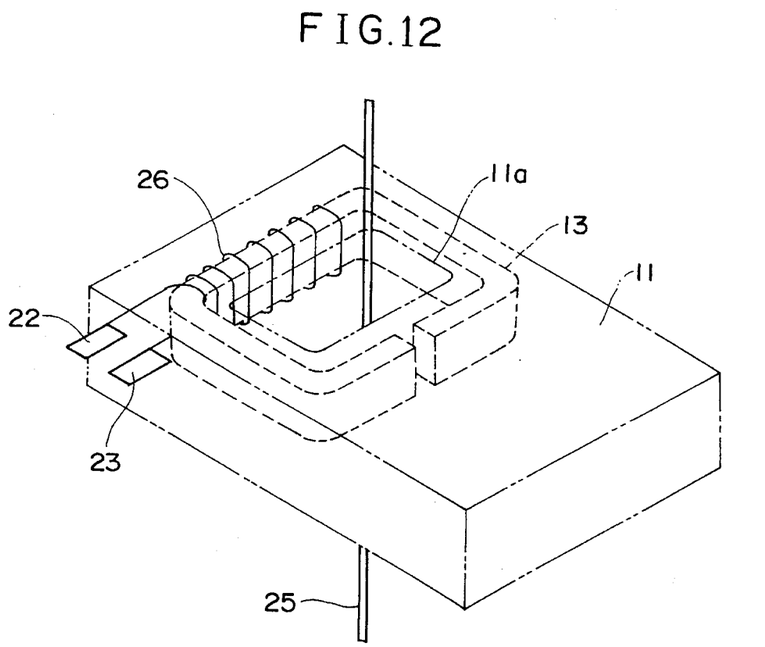
FIG. 12 is a schematic perspective view showing the manner in which large and small currents are detected.

When the current detecting device 10 is used to detect a large current, an electric wire 25 (see FIG. 12) through which such a large current flows is inserted through the through hole 11a in the case 11. The Hall-effect device 14 then detects the large current flowing through the electric wire 25. When the current detecting device 10 is used to detect a small current, an electric wire for carrying such a small current is cut off, and the two ends of the electric wire are connected to the external connector terminals 22, 23. As shown in FIG. 12, a small current which flows through the electric wire passes through a coil 26 that is wound around the core 13 in the case 11. The coil 26 may be composed of the terminals 21 and the oblique patterns 24a as shown in FIG. 10, or the terminals 21 and the metal wires 37 as shown in FIGS. 11A and 11B, or the terminals 21 with the elongate inner and outer upper ends thereof. Since magnetic fluxes which pass across the gap 13a in the core 13 increase as the number of turns of the coil 26 increases, the small current flowing through the coil 26 can reliably be detected by the Hall-effect device 14.

Figure 13:
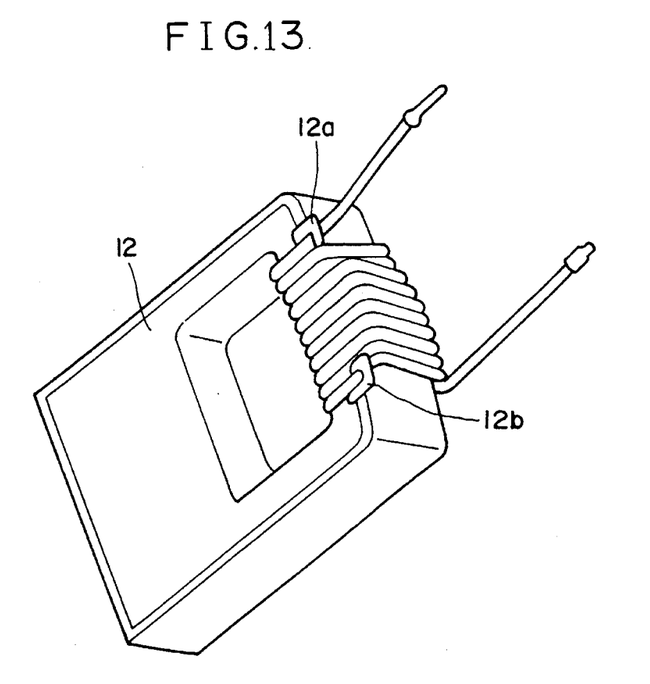
FIG. 13 is a schematic perspective view showing a coil for detecting a small current, the coil being wound directly on the case.

The coil 26 may be in the form of an electric wire wound directly on the case 11, as shown in FIG. 13. In FIG. 13, the cover 12 has two hooks 12a, 12b, and opposite end turns of the coil 26 are engaged by the respective hooks 12a, 12b. Therefore, the coil 26 can easily be anchored on the case 11.

As shown in FIG. 5A, the case 11 has a pair of attachment lobes 30, 31 on its opposite side walls, the attachment lobes 30, 31 having respective through holes 30a, 31a. The assembled current detecting device 10 may be fixed to another device by screws (not shown) which may be inserted through the through holes 30a, 31a.

In operation, the power supply circuit on the printed-circuit board 15 supplies a predetermined current to the Hall-effect device 14. Magnetic fluxes commensurate with a current to be detected which flows through an electric wire which is inserted through the through hole 11a in the case 11 are generated and pass across the gap 13a, and the Hall-effect device 14 positioned in the gap 13a produces a Hall voltage depending on the flux density of the magnetic fluxes. The produced Hall voltage is amplified by the amplifying circuit on the printed-circuit board 15, and the amplified voltage is outputted to an external device. For example, the amplified voltage is outputted to an ammeter, which then indicates the detected current.

Figure 14:
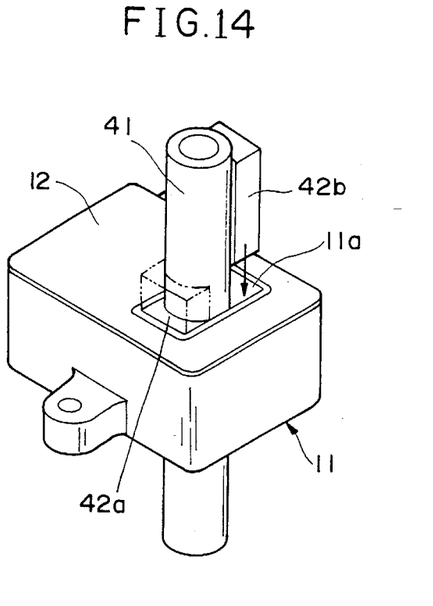
FIG. 14 is a perspective view showing the manner in which an electric wire through which a current to be detected flows is fixed in position.

As described above, the current detecting device 10 detects a current which flows through an electric wire which is inserted through the through hole 11a in the case 11. As shown in FIG. 14, an electric wire 41 which carries a current to be detected is inserted through the through hole 11a, and two fixing members 42a, 42b are inserted into the through hole 11a one on each side of the electric wire 41. The fixing members 42a, 42b have respective arcuate recesses for receiving opposite sides of the electric wire 41. When placed in the through hole 11a, the fixing members 42a, 42b clamp the electric wire 41 therebetween, thereby fixing the electric wire 41 securely in the case 11. By having a wide choice of sets of fixing members 42a, 42b available of different sizes and shapes matching different sizes and shapes of electric wires, it is possible for the current detecting device 10 to detect currents flowing in various devices, and it is also possible to fix various electric wires securely in the through hole 11a in the case 11 for increased current detection accuracy.

Figure 15:
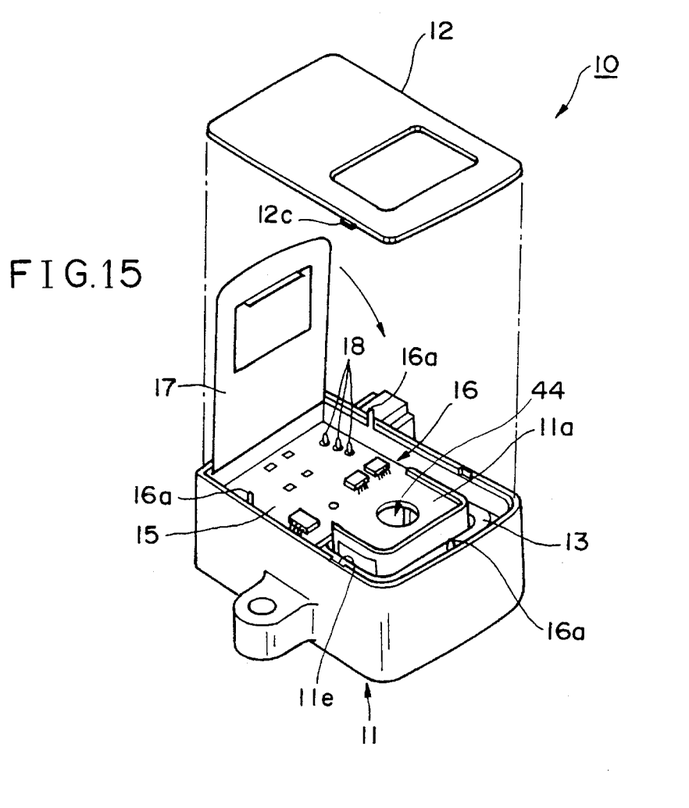
FIG. 15 is an exploded perspective view of an arrangement for fixing an electric wire through which a current to be detected flows, with a printed-circuit board.

FIG. 15 shows an arrangement for fixing an electric wire through which a current to be detected flows, with a printed-circuit board. As shown in FIG. 15, a printed-circuit board 15 has a portion extending into the through hole 11a in the case 11, and the extending portion has a through hole 44 having such a diameter which matches the outer profile of an electric wire which carries a current to be detected. The electric wire is inserted through the through hole 44 for the Hall-effect device to detect a current flowing through the electric wire.

Figure 16:
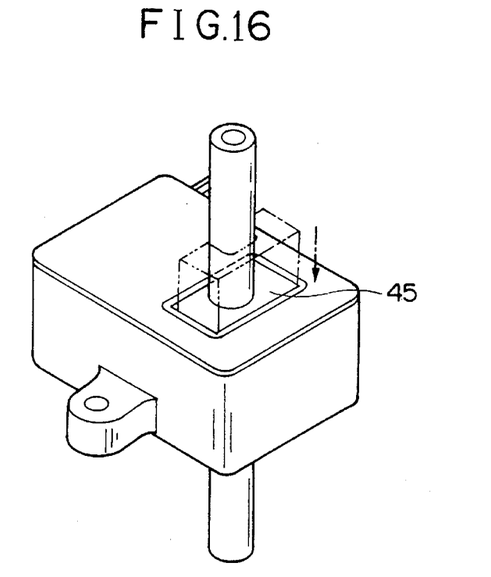
FIG. 16 is a perspective view of another arrangement for fixing an electric wire through which a current to be detected flows, in position.

FIG. 16 shows another arrangement for fixing an electric wire through which a current to be detected flows, in position. As shown in FIG. 16, a single fixing member 45 is fitted in the through hole 11a in the case 11 and has a through hole defined therein. An electric wire 46 is inserted through and fixed in the through hole in the fixing member 45 for the Hall-effect device to detect a current flowing through the electric wire.

Figure 17:
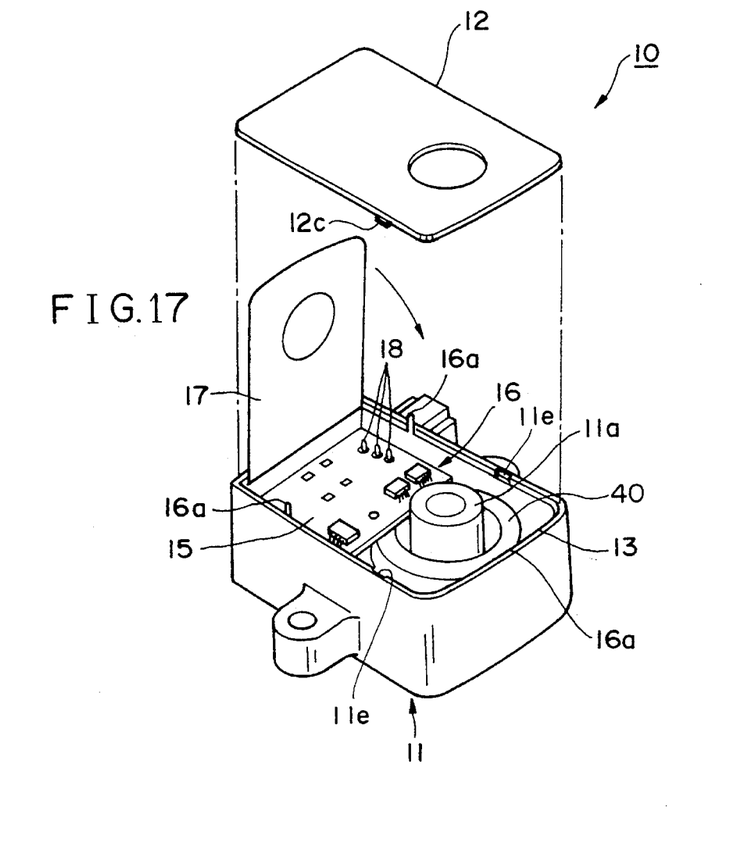
FIG. 17 is an exploded perspective view of a current detecting device, with a cover detached, which employs a circular core.

In the above embodiments, the core 13 is of a rectangular shape. However, as shown in FIG. 17, the current detecting device 10 may employ a circular core 40. The case 11 has a cylindrical through hole 11a, and the cover 12 and the shield cover 17 have respective circular holes held in registry with the cylindrical through hole 11a. The other details of the current detecting device 10 shown in FIG. 17 are identical to those of the current detecting device 10 which employs the rectangular core 13.

In the above embodiments, the interior space defined by the case 11 and the cover 12 is shielded by the shield member 16 and the shield cover 17. However, the case 11 and the cover 12 may be molded of synthetic resin, and a metal film may be deposited as a shield layer on the case 11 and the cover 12 by vacuum evaporation, with the shield member 16 and the shield cover 17 being dispensed with.

Alternatively, the case 11 and the cover 12 may be molded of metal or electrically conductive synthetic resin to shield the interior space defined therein, and the shield member 16 and the shield cover 17 may be dispensed with. In the case where the case 11 and the cover 12 are molded of metal or electrically conductive synthetic resin, the walls of the through hole 11a, the upstanding portion 11b, and the ridge 11c are molded of nonmagnetic synthetic resin in order to prevent magnetic fluxes produced in the core 13 from being reduced. The cover 12 may have a bend end or flange which may be pressed into the case 11.

With the current detecting device according to the present invention, as described above, a first engaging member of an insulating material which is integrally formed with the gap in the core is brought into engagement with a second engaging member on an inner surface of the case, thereby positioning the core securely in the case. Since the core can reliably be arranged in place in the case simply by engagement with the case, the current detecting device can be assembled easily and highly accurately through a simple structure.

The Hall-effect device mounted on the printed-circuit board can be positioned reliably centrally in the gap in the core by fitting the positioning holes over the pins on the core. Consequently, the Hall-effect device can be positioned highly accurately through a simple process. The current detecting device can thus be assembled at a low cost and can detect a current highly accurately.

The shield cover is placed over the shield member to cover the upper opening of the shield member. Then, the teeth projecting upwardly from the side edges of the shield member are bent over onto the shield cover and soldered thereto. Accordingly, the shield cover and the shield member can easily provide an effective shield effect through a simple structure.

The connector pin for connection to ground can be connected to the shield member when it is soldered to the shorted-type through capacitor. Since it is not necessary to connect a ground wire to the shield member using a harness or the like, the number of parts used is reduced, and the shield member can be grounded easily through a simple structure.

The coil is wound directly around the core. After the core has been housed in the case, the inner ends of the terminals are connected successively to the outer ends of the adjacent terminals with patterns on the printed-circuit board, or with metal wires, or the ends of the terminals are directly connected, thereby providing a coil of plural turns around the core. Inasmuch as magnetic fluxes produced in the coil by the coil and flowing across the gap to act on the Hall-effect device are commensurate with the number of turns of the coil, even a small current flowing through the coil can reliably be detected by the Hall-effect device.

Although certain preferred embodiments of the present invention has been shown and described in detail, it should be understood that various changes and modifications may be made therein without departing from the scope of the appended claims.

What is claimed is:

1. A current detecting device comprising:

a case assembly having a through hole for insertion therethrough of an electric wire which carries a current to be detected, said case including an interior surface having a projection extending therefrom;

a ring-shaped core disposed in said case assembly in surrounding relation to said through hole, said ring-shaped core having a gap defined therein, and further including an engaging member of an insulating material, said engaging member being integrally fixed to said core and positioned in said gap;

a printed-circuit board disposed in said case assembly;

a Hall-effect device mounted on said printed-circuit board, said Hall-effect device and said printed circuit board being oriented so that said Hall-effect device is disposed in said gap of said ring-shaped core;

a power supply circuit mounted on said printed-circuit board for supplying a current to said Hall-effect device; and an amplifying circuit mounted on said printed-circuit board for amplifying a Hall voltage produced by said Hall-effect device; wherein said engaging member and said projection engage with each other so that said engaging member is held in engagement with said projection and thereby positions said core relative to said case assembly, said circuit board includes a pair of positioning holes defined therein near said Hall-effect device, and said engaging member includes a pair of pins disposed near said gap, said pins engaging with said positioning holes to position said Hall-effect device in said gap.

2. A current detecting device according to claim 1, wherein said case assembly is molded of synthetic resin, and has a metal film disposed as an electromagnetic shield on said case assembly.

3. A current detecting device according to claim 1, wherein said case assembly is molded of metal.

4. A current detecting device according to claim 1, wherein said case assembly is molded of conductive synthetic resin.

5. A current detecting device according to claim 1, wherein said projection includes a threaded hole and said printed-circuit board includes an attachment hole that overlies said threaded hole, said current detecting device further comprising a screw threaded through the attachment hole into the threaded hole to securely position said printed-circuit board relative to said case assembly.

6. A current detecting device according to claim 5, wherein said engaging member includes a second attachment hole that overlies said threaded hole when said engaging member and said projection are engaged, and wherein said screw is also threaded through the second attachment hole to securely position said core relative to said case assembly.

7. A current detecting device according to claim 6, wherein said projection includes an upstanding portion having a longitudinal axis in a first direction and a ridge having a longitudinal axis in a second direction, and wherein said engaging member engages with said upstanding portion to position said core in the second direction and with said ridge to position said core in the first direction.

8. A current device according to claim 7, wherein said threaded hole is formed in said upstanding portion.

9. A current detecting device according to claim 1, wherein said projection includes an upstanding portion having a longitudinal axis in a first direction and a ridge having a longitudinal axis in a second direction, and wherein said engaging member engages with said upstanding portion to position said core in the second direction and with said ridge to position said core in the first direction.

10. A current detecting device comprising:

a case assembly having a through hole for insertion therethrough of an electric wire which carries a current to be detected, said case including a bottom panel having an upstanding portion and a ridge extending therefrom, said upstanding portion having a pair of threaded holes defined in an upper surface thereof;

a ring-shaped core disposed in said case assembly in surrounding relation to said through hole, said ring-shaped core having a gap defined therein, and further including an engaging member of an insulating material, said engaging member being integrally fixed to said core and positioned in said gap, and said engaging member including a pair of pins projecting upwardly from an upper surface thereof;

a printed-circuit board disposed in said case assembly, and including a pair of positioning holes and a pair of attachment holes defined therein;

a Hall-effect device mounted on said printed-circuit board near said positioning holes, said Hall-effect device and said printed circuit board being oriented so that said Hall-effect device is disposed in said gap of said ring-shaped core;

a power supply circuit mounted on said printed-circuit board for supplying a current to said Hall-effect device;

an amplifying circuit mounted on said printed-circuit board for amplifying a Hall voltage produced by said Hall-effect device; and a pair of screws; wherein said engaging member engages with said upstanding portion to securely position said core relative to said case assembly in a first direction, said engaging member engages with said ridge to securely position said core relative to said case assembly in a second direction, said pins of said engaging member engage with said positioning holes to position said Hall-effect device in said gap, said attachment holes of said printed circuit board are aligned with said threaded holes of said upstanding portion, and said screws are threaded through the attachment holes into the threaded holes to securely position the printed-circuit board in the case assembly and thereby position the Hall-effect device in the gap of the core.

* * * * *